US008008958B2

(12) United States Patent
Lefebvre

(10) Patent No.: US 8,008,958 B2
(45) Date of Patent: Aug. 30, 2011

(54) ELECTRONIC DEVICE AND METHOD OF CORRECTING CLOCK SIGNAL DEVIATIONS IN AN ELECTRONIC DEVICE

(75) Inventor: Fabien Lefebvre, Evrecy (FR)

(73) Assignee: NXP B.V., Eindhoven (NL)

( * ) Notice: Subject to any disclaimer, the term of this patent is extended or adjusted under 35 U.S.C. 154(b) by 29 days.

(21) Appl. No.: 12/593,617

(22) PCT Filed: Apr. 15, 2008

(86) PCT No.: PCT/IB2008/051441
§ 371 (c)(1),
(2), (4) Date: Sep. 29, 2009

(87) PCT Pub. No.: WO2008/132644
PCT Pub. Date: Nov. 6, 2008

(65) Prior Publication Data
US 2010/0109728 A1     May 6, 2010

(30) Foreign Application Priority Data

Apr. 29, 2007    (EP) ..................................... 07290374

(51) Int. Cl.
*H03K 3/017* (2006.01)
(52) U.S. Cl. ....................................... 327/175; 327/172
(58) Field of Classification Search .................. 327/172, 327/175, 165, 166
See application file for complete search history.

(56) References Cited

U.S. PATENT DOCUMENTS

| 6,094,080 | A | 7/2000 | Jeong et al. | |
|---|---|---|---|---|
| 6,967,514 | B2 * | 11/2005 | Kizer et al. | 327/175 |
| 7,282,974 | B2 * | 10/2007 | Lee | 327/158 |
| 7,535,270 | B2 * | 5/2009 | Lee et al. | 327/147 |
| 7,598,786 | B2 * | 10/2009 | Cheng | 327/175 |
| 2002/0008548 | A1 | 1/2002 | Kimura | |
| 2003/0085748 | A1 | 5/2003 | Ryu | |
| 2004/0140832 | A1 | 7/2004 | Shiah | |
| 2004/0189364 | A1 | 9/2004 | Lee et al. | |
| 2005/0206420 | A1 | 9/2005 | Labrum et al. | |

FOREIGN PATENT DOCUMENTS

EP      1139569 A     10/2001

* cited by examiner

*Primary Examiner* — Hai L Nguyen

(57) ABSTRACT

A digital electronic device is provided which comprises a digital clock deviation detecting means and a digital clock correcting means. The clock deviation detecting means is used to detect a deviation of a first clock signal of the electronic device and/or the duty cycle of the first clock signal. The clock correcting means is used to correct the first clock signal and/or the duty cycle of the first clock signal if the clock deviation detecting means has detected a deviation of the first clock signal and/or the duty cycle of the first clock signal. The clock correcting means comprises at least a first and second compensation path (P1, P2) for compensating deviations in the first clock signal and/or the duty cycle thereof, when the first clock signal passes through the first or second path. The first path (P1) does not induce a compensation and is selected if the clock deviation detecting means has not detected a deviation in the first clock signal. The second path (P2) includes a first compensation and is selected if the clock deviation detecting means has detected a deviation of the first clock signal.

3 Claims, 6 Drawing Sheets

ELECTRONIC DEVICE AND METHOD OF CORRECTING CLOCK SIGNAL DEVIATIONS IN AN ELECTRONIC DEVICE

FIELD OF THE INVENTION

The present invention relates to an electronic device and a method of correcting clock signal deviations in an electronic device.

BACKGROUND OF THE INVENTION

The accuracy of duty cycles of a clock of an electronic device with high frequency interfaces, like a DDR-SDRAM interface, is very important. Typically, the duty cycle of the clock is carefully considered during the design of an integrated circuit or an electronic device. Furthermore, the duty cycle of the clock may also be verified by simulations. However, due to variations in the manufacturing process some discrepancies may be present for different electronic devices or integrated circuits. Due to these discrepancies, the interfaces may not be able to operate as fast as designed, (e.g. because of variations of the duty cycle) which could lead to a loss in the overall performance of the device.

FIG. 1 shows a schematic representation of a communication between an integrated circuit IC and an external memory DDR or an external device according to the prior art. While the integrated circuit IC is designed to generate a clock CLK, a clock CLK1 different from the designed clock CLK is transmitted via an interface to the external memory DDR. The deviations in the clock signals may be due to variations in the manufacturing process of the integrated circuit.

US Patent Publication No. 20040189364 A1 (published Sep. 30, 2004) titled, "Integrated Circuit Devices having Improved Duty Cycle Correction and Methods of Operating the Same," of Woo-Jin Lee, et al., discloses an integrated circuit with a duty city correction. Here, a duty cycle correction of high speed interfaces like a DDR interface is described. However, the solution described in this document relates to an analogue solution. Due to an analogue solution, drift between samples may cause serious problems.

SUMMARY OF THE INVENTION

It is therefore an object of the invention to provide an electronic device with an interface which has the ability to correct discrepancies in a clock of the electronic device.

This object is solved by an electronic device according to claim 1 and a method for correcting clock signal deviations in a digital electronic device.

Therefore, a digital electronic device is provided which comprises a digital clock deviation detecting means and a digital clock correcting means. The clock deviation detecting means is used to detect a deviation of a first clock signal of the electronic device and/or the duty cycle of the first clock signal. The clock correcting means is used to correct the first clock signal and/or the duty cycle of the first clock signal if the clock deviation detecting means has detected a deviation of the first clock signal and/or the duty cycle of the first clock signal. The clock correcting means comprises at least a first and second compensation path for compensating deviations in the first clock signal and/or the duty cycle thereof, when the first clock signal passes through the first or second path. The first path does not induce a compensation and is selected if the clock deviation detecting means has not detected a deviation in the first clock signal. The second path includes a first compensation and is selected if the clock deviation detecting means has detected a deviation of the first clock signal.

Accordingly, once a deviation in the clock signal is detected, this deviation can be compensated by choosing among compensation paths.

According to an aspect of the invention, a non-volatile memory is provided for storing the detection results and/or the selection of the compensation path. Therefore, the results can be re-used during upcoming processings.

The invention also relates to a method for detecting clock signal deviations in a digital electronic device, wherein the electronic device comprises a digital clock deviation detecting means and a digital clock correcting means. A deviation in a first clock signal and/or the duty cycle of the first clock signal is detected. The first clock signal and/or the duty cycle of the first clock signal is corrected if a deviation of the clock signal and/or the duty cycle of the first clock signal has been detected. At least a first and second compensation path is provided for compensating deviations in the first clock signal and/or the duty cycle of the first clock signal, when the first clock signal passes through the first or second path. The first compensation path does not include a compensation and is selected if no deviation of the first clock signal has been detected. The second compensation path includes a first compensation and is selected if a deviation of the first clock signal has been detected.

According to an aspect of the invention, the deviations in the first clock signal are determined by measuring the duty cycle of the first clock at edges of a second clock signal, wherein the second clock signal is slower than the first clock signal. Expected values of the duty cycle of the first clock signal are computed and the measured and the computed values of the duty cycle of the first clock signal are compared. A first counter is incremented with a first or second increment according to the comparison of the measured and computed values of the duty cycle of the first clock signal.

The invention relates to the idea to measure and correct the clock of an electronic device in real time. This can be performed by selecting between pre-calibrated paths each having an influence on the clock, in particular on the duty cycle of the clock. One of these paths may constitute a neutral path without affecting the clock. Such a path could be selected by default. The other paths may relate to altering the duty cycle of the clock as compared to the neutral duty cycle.

The invention further relates to the idea to provide a purely digital implementation of the duty cycle correction. The behavior of the electronic device according to the invention is therefore predictable and repeatable in particular with respect to the time for correction, the steps of correction, etc. Furthermore, the solution according to the invention is unsensitive with respect to temperature and power supply deviations.

Any information regarding the correction of the duty cycle can be stored in a non-volatile memory such that this information can be accessed later, e.g. when the integrated circuit or electronic device is powered up. Accordingly, this information can be reused as a starting point such that the correction of the duty cycle does not have to be started all over again. The correction algorithm may be implemented by software wherein the measurement and the correction processes may be implemented as separate processes. Therefore, the overall process may be tuned after production such that a redesign can be prevented.

The invention further relates to the idea to detect a deviation of a duty cycle in a clock signal within an electronic device. The deviation can be reduced by transmitting a clock signal through a pre-calibrated path. This is performed by firstly measuring or detecting a drift in the duty cycle of a sensitive clock within an electronic device. Such a clock may be the clock for a memory interface. If the clock cycle is within predefined values, no correction will be performed. However, if this is not the case, the clock signal is transmitted through a pre-calibrated path.

Other aspects of the invention are defined in the dependent claims.

BRIEF DESCRIPTION OF THE DRAWINGS

Embodiments and advantages of the present invention will now be described in more detail with reference to the Figures.

DETAILED DESCRIPTION OF EMBODIMENTS

Figure 1:
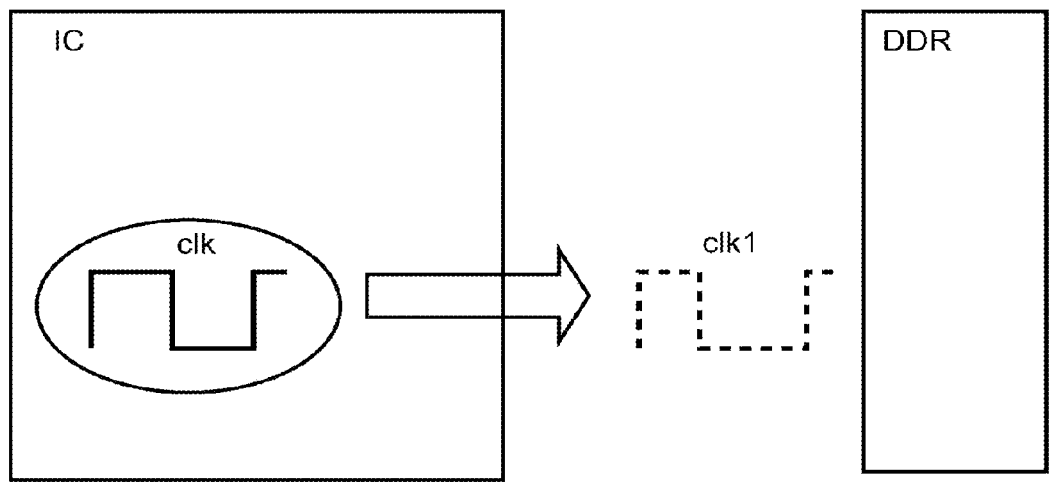
FIG. 1 shows a schematic representation of a communication between an integrated circuit and an external memory according to the prior art.
Figure 2:
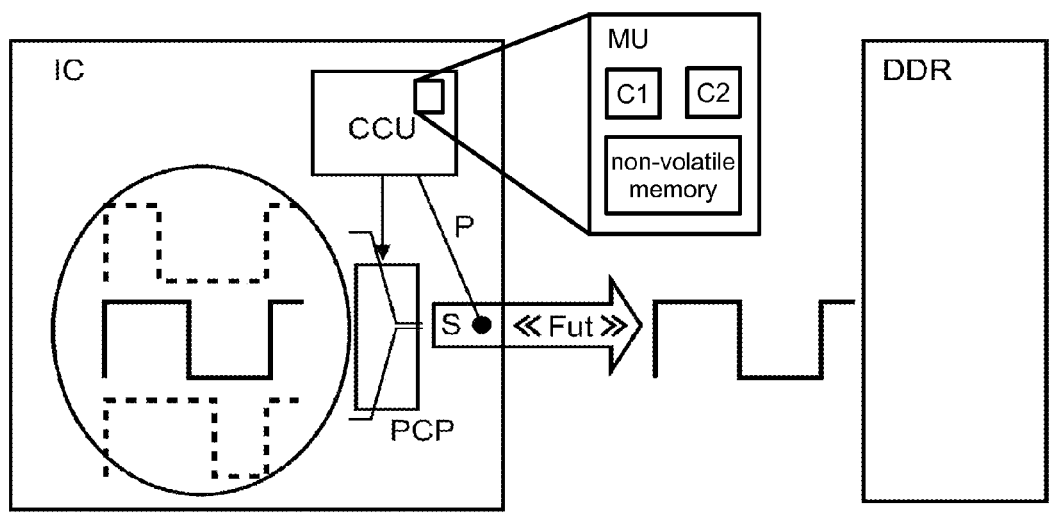
FIG. 2 shows a schematic representation of a communication between an integrated circuit and an external device according to a first embodiment.

FIG. 2 shows a schematic representation of a communication between an integrated circuit and an external device according to a first embodiment. The integrated circuit IC comprises a clock generating unit CGU for generating a first clock clk with a first frequency Fut and a clock checking unit CCU for checking the clock generated by the clock generating unit CGU and a plurality of pre-calibrated paths PCP. According to the result of the clock checking unit CCU, one of the pre-calibrated paths PCP is selected.

The clock checking unit CCU is preferably based on a synchronous design. It serves to measure the first frequency Fut and e.g. compares it to a second frequency Fslow to determine how many clock cycles at the first frequency Fut are within $2^n$ clock cycles of the second frequency Fslow. Preferably, the clock checking unit CCU outputs a minimum and a maximum value, i.e. Imin and Imax. The comparison is preferably performed with respect to the modular $2^n$ part. Furthermore, this comparison can be performed permanently or at predefined intervals.

The clock checking unit CCU furthermore performs a process at the second frequency Fslow. Here, a first internal counter "phase" C1 is incremented by the value of Imin or Imax at each clock cycle. The first frequency Fut is sampled regularly and the value thereof is compared to an expected value. According to the result of this comparison, the next increment on the "phase" value in the first counter C1 is switched between Imin and Imax.

Preferably the second clock signal Fslow has no relation with the first clock Fut and is slower than the first clock signal Fut. It should be noted that a ratio between the first and second clock does not have to be a simple fraction. The first counter C1 is provided for n bits at the second frequency Fslow. At each clock cycle a first value of floor (Fut/Fslow×$2^n$)=Imin or the value ceil(Fut/Fslow×$2^n$)=Imax is incremented.

However, if a drift is present between the clocks, the values Imin and Imax can be measured instead of being computed. This may for example be performed by counting $2.\sup n$ cycles at the second frequency Fslow and by using a further free-running counter C2 at the first frequency Fut and then comparing these values. It should be noted that the higher the value of n, the more precise the result. Preferably, the values of Imin and Imax are checked permanently, but alternatively these two counters may also be checked at regular intervals. The counters C1 and C2 may be comprised in a measuring unit MU.

A further aspect of the detection of any deviations in the duty cycle of the clock signal is the question when to choose between the increment values of Imin and Imax. The clock at the first frequency Fut is sampled as a regular signal. If the first phase counter C1 contains a value which is not expected and if Imin is chosen, it will be clear that the increment of the phase counter C1 is too low and that a switch of the increment has to be performed to Imax. However, if a "0" is expected but a "1" is read, then the value of Imin is to be selected again. As soon as the two frequencies are synchronized, a precise measurement of the duty cycles will be enabled. If the duty cycle is not correct, one of the pre-calibrated paths PCP may be chosen and the clock is passed through the path to compensate deviations of the clock signals. The measuring unit MU may further comprise a non-volatile memory for storing the detection and/or the selection of the compensation path.

Figure 3:
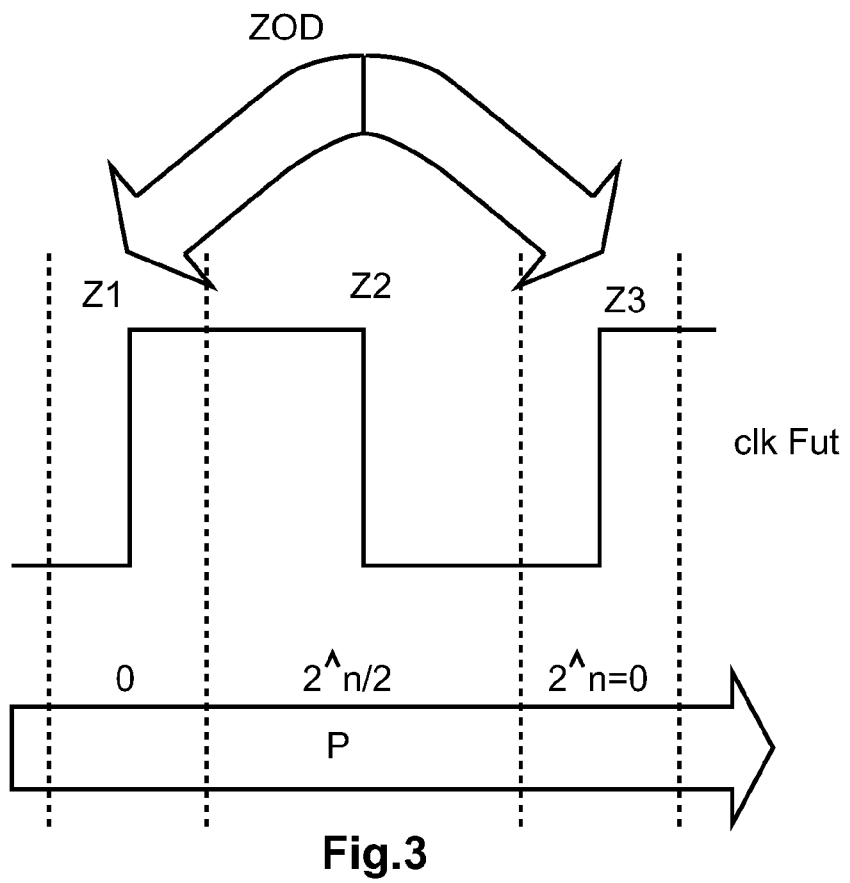
FIG. 3 shows a representation of a method for determining a clock according to a first embodiment.

FIG. 3 shows a representation of a method for determining a clock signal according to the invention. Here, a zone of decision ZOD is defined which is used to determine the value of the first clock Fut and in particular its duty cycle. A first, second and third zone Z1, Z2, Z3 is defined with respect to values P of the first counter C1. In the first zone Z1 the value P of the first counter C1 is 0. In the second zone Z2 the value P of the first counter C1 is $2^n/2$. In the third zone Z3 the value P of the first counter C1 is $2^n=0$. Accordingly, the value of the duty cycle is determined and compared to an expected value. The width of this zone is a trade-off between the rapidity of the convergence and the ability to measure the duty cycles.

To perform the above described determination of the value of the first clock signal the clock checking unit CCU may comprise a measuring unit MU for measuring how many clock cycles of the first frequency Fut are within $2^p$ clock cycles of the second frequency Fslow. Preferably, the measuring unit MU comprises at least the two counters C1, C2. The output of the measuring unit MU will correspond to the value Imin and Imax representing the minimum and the maximum value. In case of a stable clock signal, Imax should correspond to Imin+1.

Accordingly, at each clock cycle of the second frequency Fslow, the value of the clock cycle of the first frequency Fut is sampled. The variable "phase" P will correspond to the position of a rising edge of the second frequency Fslow within a period of the first signal Fut. As the precision corresponds to n bits, the value of phase P will be between 0 and $2^{n-1}$. If the value of phase P is "0" (first zone Z1), then the rising edge of the second frequency Fslow is very close to the rising edge of the first frequency Fut. However, if the phase P is around $2^n/2$ (second zone), then the rising edge of the second frequency Fslow is very close to the falling edge of the first frequency Fut if the duty cycle of the first frequency Fut is 50%. If the value of phase is known it can be determined whether the sampling of the first frequency Fut will result in "1" or "0".

The value of the phase P is determined by starting from an arbitrary value. If the sampling of the first frequency Fut results in a "1" but a "0" was expected or vice versa, the assumption appears to be wrong. However, if the assumption is correct, the next value of the phase will be phase+Imin (MOD $2^n$) or phase+Imax (MOD $2^n$).

Furthermore, as a drift is to be detected, this may be performed by determining which increment should be used and by ensuring that the first clock Fut does not have a duty cycle of 50%. Firstly, the rising edge of the first clock Fut and the values of the phase P in the zone ZOD are determined.

Figure 4:
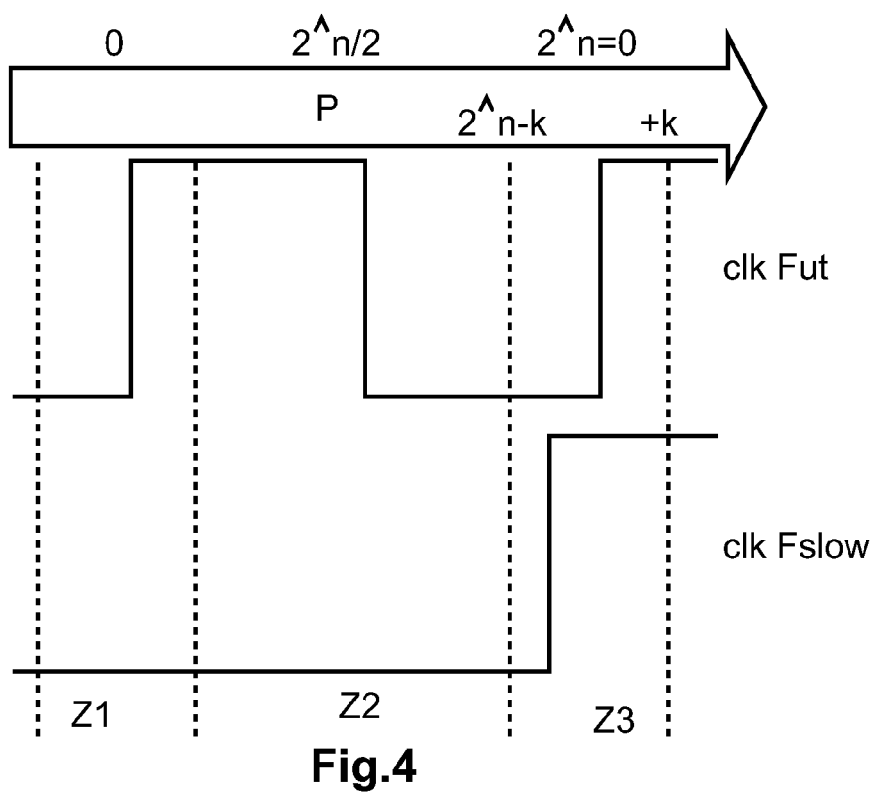
FIG. 4 shows a representation of a method for determining a clock cycle according to a second embodiment.

FIG. 4 shows a representation of a method for determining a clock cycle according to a second embodiment. In FIG. 4, the clock CLK Fut of the first signal Fut and the clock CLK Fslow of the second signal Fslow are depicted. Furthermore, the values of phase P in the first, second and third zone Z1, Z2, Z3 are also depicted, namely 0, $2^n/2$, $2^n-k$, $2^n=0$ and +k. First of all, it is determined whether the current phase value is below k or above $2^n-k$. If this is not the case, the current increment is maintained. However, if this is the case and an '1' is expected to be sampled and the increment corresponds to Imax while only a "0" is sampled, the increment is changed to the minimum value Imin. However, if it is expected that a "0" is sampled and the increment corresponds to Imin and a "1" is read, the increment is set to Imax.

If the value of phase P is not below k or above $2^n-k$, then the process continues. If the process converges, the minimum and maximum value for the duty cycle can be measured.

During a second iteration and by means of the measured min and max values for the duty cycle, e. g. the duty cycle may not be between 40 and 60% but rather between 45 and 50% (as determined by the choice of k). This knowledge will enable the tuning of the increment in particular with respect to a decision around a falling edge of the first signal Fut. Therefore, in the second iteration, the measurements will be more accurate.

Accordingly, the first clock Fut is measured within the second clock Fslow and the precision of the phase is $\frac{1}{10}$ instead of $2^n$. Furthermore, it is assumed that the first signal Fut is 1.3 times faster than the second signal Fslow while Imin=$\frac{2}{10}$ and Imax=$\frac{4}{10}$.

Figure 5:
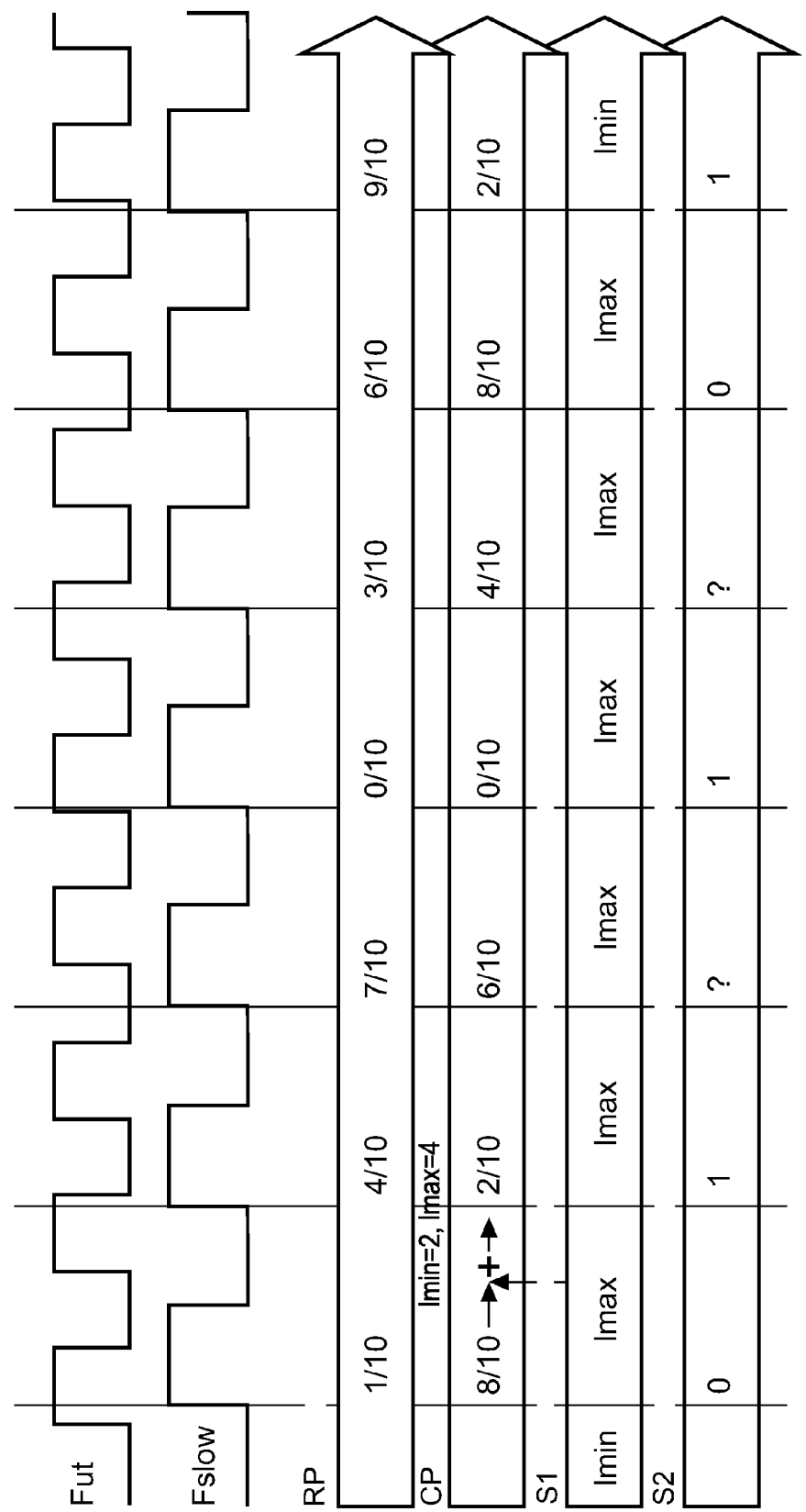
FIG. 5 shows a representation of the synchronization of a computed phase with respect to a real phase.

FIG. 5 shows a representation of the synchronization of a computed phase with respect to a real phase. Here, the clock signal of the first signal Fut, the clock signal of the second signal Fslow, the real phase RP, the computed phase CP, a first step S1 and a second step S2 is depicted. The first clock Fut is measured or sampled within or at the second clock Fslow, e.g. at the trailing edges of the second clock Fslow. The precision of the values of phase P is $\frac{1}{10}$ instead of "$2^{n}$". Furthermore, it is assumed that the first signal Fut is 1.3 times faster than the second signal Fslow while Imin=$\frac{2}{10}$ and Imax=$\frac{4}{10}$. Firstly, the computed phase CP is synchronized with the real phase RP. Then the duty cycle of the first signal Fut is measured. For example, if the sampled value "1" and the computed phase value is $\frac{5}{10}$, then the duty cycle is more than 50%. However, if the sampled value corresponds to "0" and the computed phase value corresponds to $\frac{6}{10}$, then the duty cycle is less than 60% which corresponds to the maximum value for the duty cycle. At step S1, the increments may be switched if the expected value of the first signal Fut does not correspond to the detected value. Step S2 depicts the expected phase value if the first signal Fut is "1" if the computed phase CP is 0, 1, 2. If a "0" is expected the phase value can be 7, 8, or 9. Otherwise the value will be out of the determined zone ZOD. Thereafter, when the minimum and maximum value of the duty cycle is determined, a second zone for decision can be found in order to refine the computing.

Figure 6:
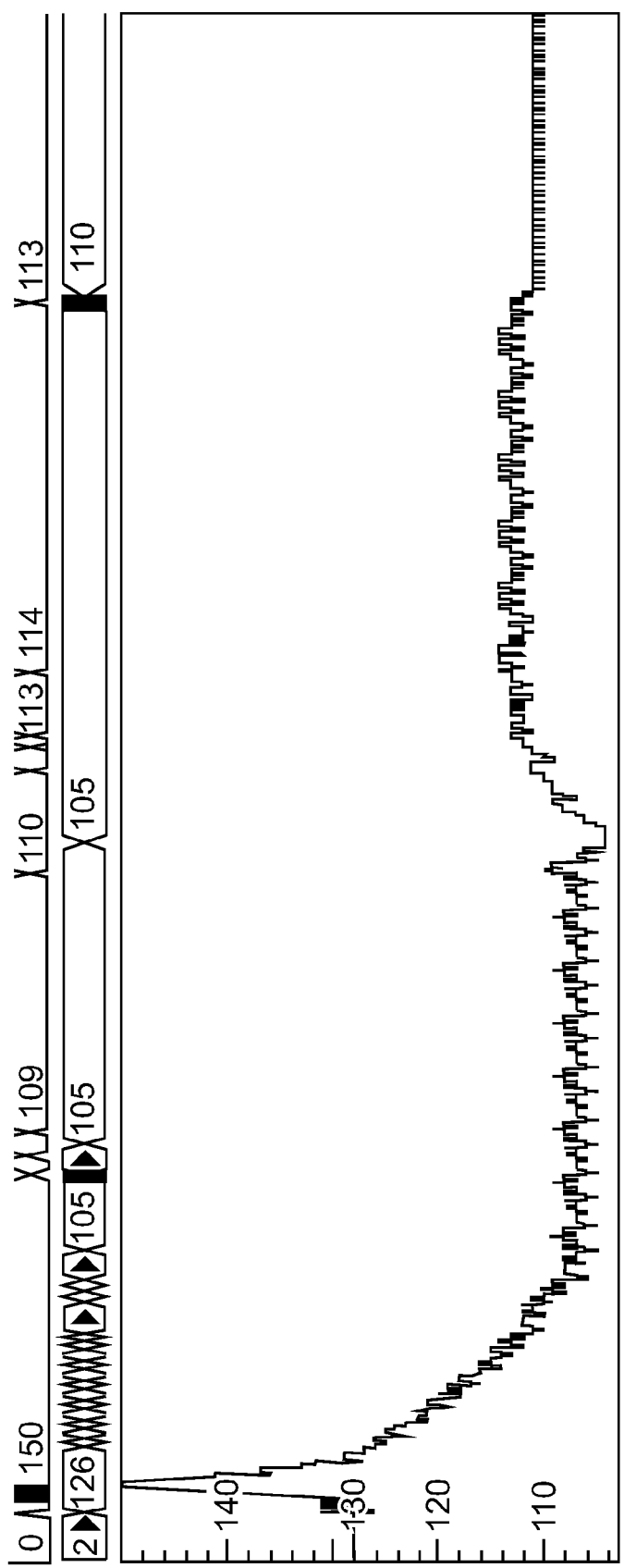
FIG. 6 shows a graph according to a further embodiment.

FIG. 6 shows a graph according to a further embodiment. Here, an example is depicted for illustrating the above described process. The precision can be selected as more than $\frac{1}{10}$. Furthermore, the minimum and maximum value may be reset between different steps. P corresponds to 10 and n corresponds to 8, i.e. the duty cycle corresponds to (113+10)/2/256=43.55% while the target is 43.75%.

First of all, a hard reset is released and the duty cycle is not used. The values on top of the drawing correspond to the minimum and maximum value of the duty cycle. Thereafter, any statistics for the minimum and maximum value of the duty cycle are reset and the results are not used. The effects of the duty cycles are clearly visible and the statistics can be reset such that the results are improved.

Figure 7:
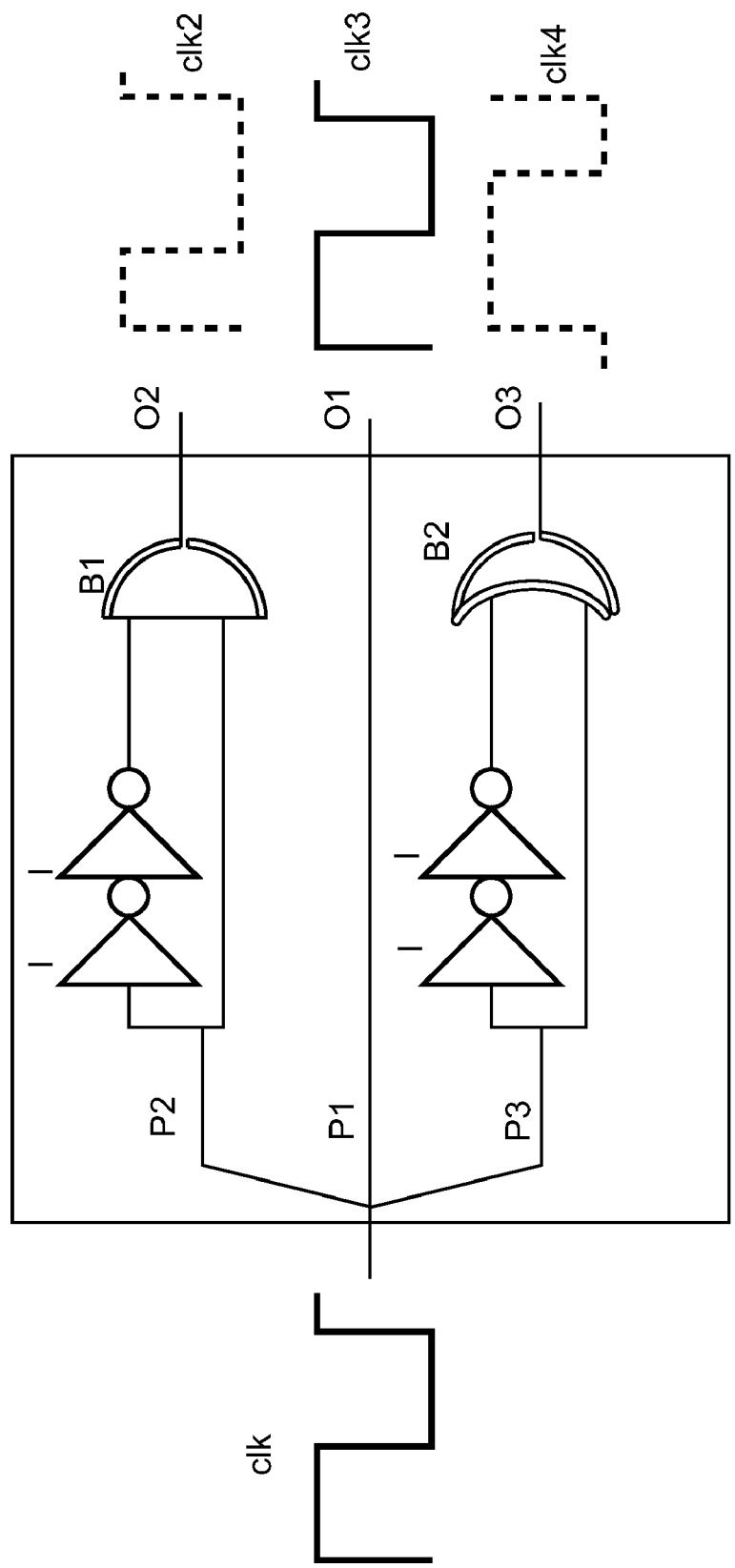
FIG. 7 shows a representation of pre-calibrated paths according to a further embodiment.

FIG. 7 shows a representation of the pre-calibrated paths according to a further embodiment. The clock cycle clk is input to the pre-calibrated paths PCB. According to FIG. 7, three different paths P1, P2, P3 are depicted such that three different outputs O1, O2, O3 are possible. The first path PCP1 corresponds to the direct path without influencing the clock signal. However, if a drift occurs within the duty cycles, the second or third path P2, P3 may be used to compensate for the deviations by means of inverters I. For example, if a duty cycle of 50% is expected while drifts occur between samples, duty cycles are measured, e.g. 45% on one sample (i.e. 45% high and 55% low). Such a sample will select the third path to compensate for the drift. The above-described selection need only be done once either at power up or alternatively it can be stored in a non-volatile memory.

The phase value is computed based on a previous value phase. If the relative frequencies of the clock and if the phase value at one clock cycle of the clock $F_{slow}$ is known, the phase value at the next clock cycle is also known. However, at start-up, a previous value or phase is not known. Therefore, a random value e.g. zero can be used as the starting point. If the values of phase are within the zone of decision, it can be determined afterwards if the computed value or phase is correct or not. Furthermore, it can be determined whether the value or phase has been underestimated or overestimated. Based on this check, the increment can be adapted accordingly. The above-described scheme will converge if the first and second clock signal Fslow and Fut are asynchronous and if the ratio between these frequencies is not a simple fraction. It should be noted that once the two clock frequencies are synchronized, the phase value can be considered as good. The precision thereof will depend on the frequencies of the clocks.

Figure 8:
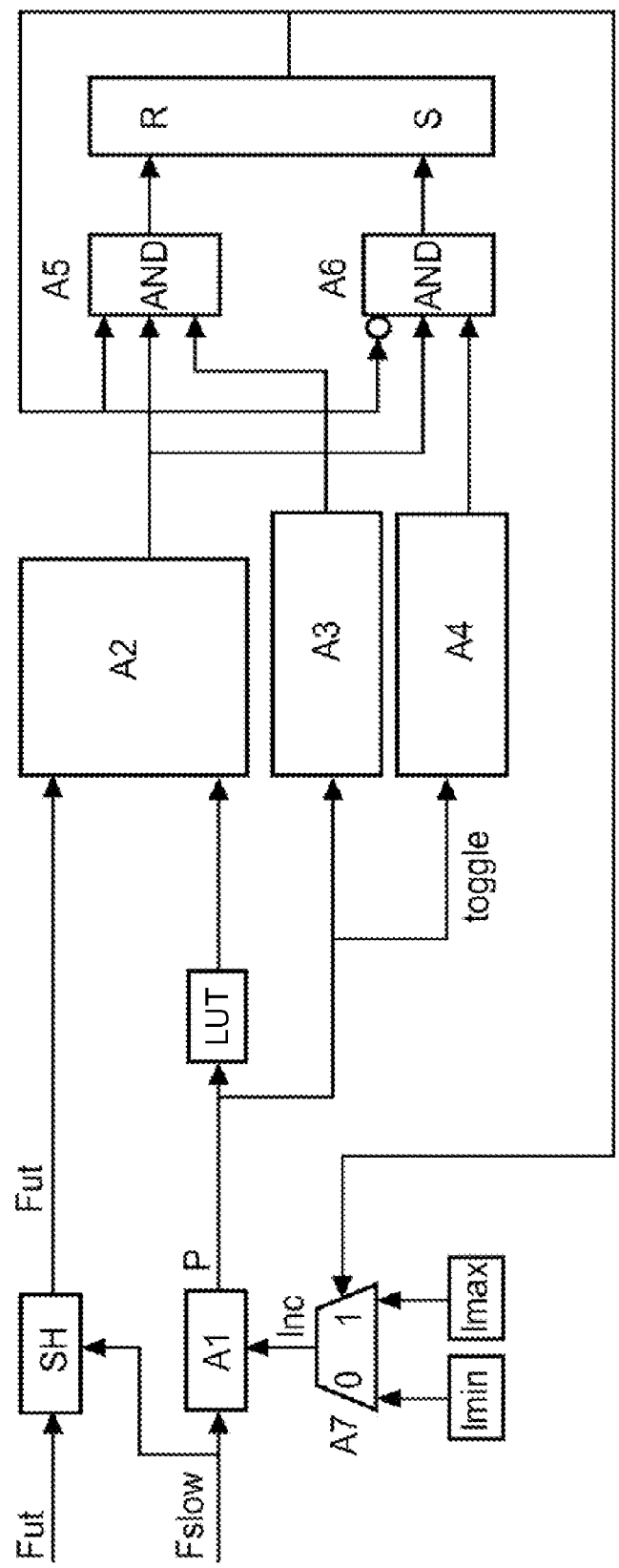
FIG. 8 shows a schematic block diagram of a clock checking unit.

FIG. 8 shows a schematic block diagram of a clock checking unit. The clock checking unit CCU receives the first and second signal Fut and Fslow as inputs. A first unit SH receives the first and second signal Fut, Fslow to sample the first signal Fslow at the edge of the second signal Fslow. The second signal Fslow is received by a second unit A1 for computing the phase value P. The output of the second unit A1 is forwarded to a third unit LUT to determine the expected value of the second signal Fut. The output of the first and third unit SH, LUT is forwarded to a fourth unit A2 to determine whether the outputs of the first and third units SH, LUT are equal. The output of the second unit A1 is forwarded to a fifth and sixth unit A3, A4. In the fifth unit A3 it is determined whether the computed phase value is within the zone of decision ZOD and after a rising edge, while it is determined in the fifth unit A3 whether the computed phase value is within the zone of decision ZOD and before a rising edge.

The clock checking unit furthermore comprises two AND units A5, A6 and a RS unit RS. The two AND units A5, A6 and the unit RS are used to decide whether the deviation of the clock signal is present. This decision will be performed based on the current state of the unit RS, i.e. the output of the unit RS is feedback to the two AND units. The two AND units A5, A6 receive the output of the second unit A2, i.e. the real value of the first clock signal Fut as sampled at the second clock signal Fslow by the unit SH. Furthermore, the expected value of the first clock signal Fut is input to the AND units A5, A6. The expected value of the first clock signal Fut is determined from the value P of the phase. Furthermore, the expected presence within the zone of decision is also input to the AND units. Based on the above-mentioned parameters, the unit RS will output a new state, which is forwarded to the ninth unit A7 to decide whether to use Imin or Imax as increments of the counter in the first unit A1. It should be noted that no decision will be taken and the previous state of the unit RS will be re-used if it is detected that the clock signal Fut is outside the zone of decision ZOD.

Accordingly, the present invention relates to a purely digital solution with a measurement unit and a compensation unit. The link between the measurement unit and the compensation unit can be software-driven in order to add flexibility and to enable a re-use of previous results.

The algorithm for the measurement of the duty cycle deviation can be alternatively performed by sampling the first clock signal Fut with the second clock signal Fslow and compute the average value which may constitute a direct indication of the duty cycle of the first clock signal Fut.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be constrained as limiting the scope of the claims.

The invention claimed is:

1. A digital electronic device, comprising:
    digital clock deviation detecting means for detecting a deviation of a first clock signal of the electronic device and/or the duty cycle of the first clock signal, said digital clock deviation detecting means configured for:
        measuring the duty cycle of the first clock signal at edges of a second clock signal, wherein the second clock signal is slower than the first clock signal;
        computing expected values of the duty cycle of the first clock signal;
        comparing the measured and the computed values of the duty cycle of the first clock signal; and
        incrementing a first counter with a first or second increment according to the comparison of the measured and computed values of the duty cycle of the first clock signal; and
    digital clock correcting means for correcting the first clock signal and/or the duty cycle of the first clock signal if the clock deviation detecting means has detected a deviation of the first clock signal and/or the duty cycle of the first clock signal;
    wherein said clock correcting means comprises at least a first and second compensation path for compensating the deviations in the first clock signal and/or the duty cycle thereof when the first clock signal passes through the first or second path;
    wherein the first compensation path does not include compensation and is selected if the clock deviation detecting means has not detected a deviation of the first clock signal;
    wherein the second compensation path includes a first compensation and is selected if the clock deviation detecting means has detected the deviation of the first clock signal.

2. The digital electronic device according to claim 1, further comprising:
    a non-volatile memory for storing the detection results and/or the selection of the compensation path.

3. A method of correcting clock signal deviations in a digital electronic device having a digital clock deviation detecting means and a digital clock correcting means, comprising the steps of:
    detecting a deviation of a first clock signal of the electronic device and/or the duty cycle of the first clock signal, the detection of the deviation including:
        measuring the duty cycle of the first clock signal at edges of a second clock signal, wherein the second clock signal is slower than the first clock signal;
        computing expected values of the duty cycle of the first clock signal;
        comparing the measured and the computed values of the duty cycle of the first clock signal; and
        incrementing a first counter with a first or second increment according to the comparison of the measured and computed values of the duty cycle of the first clock signal;
    correcting the first clock signal and/or the duty cycle of the first clock signal if a deviation of the first clock signal and/or the duty cycle of the first clock signal has been detected;
    providing at least a first and second compensation path for compensating the deviations in the first clock signal and/or the duty cycle thereof when the first clock signal passes through the first or second path,
    wherein the first compensation path does not include a compensation and is selected if no deviation of the first clock signal has been detected,
    wherein the second compensation path includes a first compensation and is selected if a deviation of the first clock signal has been detected.

* * * * *